(12) United States Patent
Hase

(10) Patent No.: US 7,858,462 B2
(45) Date of Patent: Dec. 28, 2010

(54) METHOD OF MANUFACTURING SEMICONDUCTOR DEVICE

(75) Inventor: Takashi Hase, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 4 days.

(21) Appl. No.: 12/046,531

(22) Filed: Mar. 12, 2008

(65) Prior Publication Data
US 2008/0227278 A1   Sep. 18, 2008

(30) Foreign Application Priority Data
Mar. 14, 2007 (JP) .............................. 2007-065254

(51) Int. Cl.
*H01L 21/8238* (2006.01)
(52) U.S. Cl. ........................ 438/199; 438/565; 438/655
(58) Field of Classification Search ................ 438/199, 438/585, 587, 589, 595, 652, 655
See application file for complete search history.

(56) References Cited

U.S. PATENT DOCUMENTS

| | | | | |
|---|---|---|---|---|
| 5,943,592 | A * | 8/1999 | Tsukamoto et al. | 438/486 |
| 6,033,944 | A * | 3/2000 | Shida | 438/199 |
| 6,451,701 | B1 * | 9/2002 | Wang et al. | 438/705 |
| 6,977,194 | B2 * | 12/2005 | Belyansky et al. | 438/197 |
| 7,091,563 | B2 * | 8/2006 | Chidambarrao et al. | 257/369 |
| 2004/0142546 | A1 * | 7/2004 | Kudo et al. | 438/585 |
| 2005/0106801 | A1 * | 5/2005 | Matsuda et al. | 438/199 |
| 2005/0199963 | A1 * | 9/2005 | Aoyama | 257/369 |
| 2005/0215070 | A1 * | 9/2005 | Kobayashi | 438/770 |
| 2006/0105527 | A1 * | 5/2006 | Saito | 438/275 |
| 2006/0263961 | A1 * | 11/2006 | Kittl et al. | 438/199 |
| 2007/0026600 | A1 * | 2/2007 | Komori | 438/199 |

FOREIGN PATENT DOCUMENTS

JP   2006-10043   4/2006

OTHER PUBLICATIONS

Physical Mechanism of Work Function Modulation due to Impurity Pileup at Ni-FUSI/SiO(N) Interface, Yoshinori Tsuchiya et al.
Dual Workfunction Ni-Silicide/HiSiON Gate Stacks by Phase-Controlled Full-Silicidation (PC-FUSI) Technique for nm-node LSTP and LOP Devices, Konsuko Takashi et al.

(Continued)

*Primary Examiner*—Charles D Garber
*Assistant Examiner*—Bryan R Junge
(74) *Attorney, Agent, or Firm*—Young & Thompson

(57) ABSTRACT

A method of manufacturing a semiconductor device including an NMOS transistor and a PMOS transistor is provided. The method includes: forming a silicon layer over a substrate through a gate insulating film; forming a first gate electrode and a second gate electrode by patterning the silicon layer, the first gate electrode being a gate electrode of the NMOS transistor, and the second gate electrode being a gate electrode of the PMOS transistor; selectively forming a silicon oxide film on the first gate electrode which is formed of silicon; after the selectively forming the silicon oxide film, forming a first metallic layer formed of a metal capable of forming a silicide over the first and second gate electrodes; and performing a first heat treatment such that a first silicide layer of a silicide of the first metallic layer is formed.

19 Claims, 15 Drawing Sheets

OTHER PUBLICATIONS

Dual work function phase controlled Ni-FUSI CMOS (NiSi NMOS, $Ni_2Si$ or $Ni_3Si_2$ PMOS): Manufacturability, Reliability & Process Window Improvement by Sacrificial SiGe cap, A. Veloso T. Hoffmann et a., 2000 Symposium on VLSI Technology Digest of Technical Papers.

CMOS Integration of Dual Work Function Phase Controlled Ni FUSI with Simultaneous Silicidation of NMOS (NiSi) and PMOS (Ni-rich silicide) Gates on HiSiON, A. Lauwers et al.

* cited by examiner

NMOS        PMOS

METHOD OF MANUFACTURING SEMICONDUCTOR DEVICE

This application is based on Japanese patent application NO. 2007-65254, the content of which is incorporated hereinto by reference.

BACKGROUND

1. Technical Field

The present invention relates to a method of manufacturing a semiconductor device and more specifically to a method of manufacturing a semiconductor device including an element having a Metal-Insulator-Semiconductor structure such as a field effect transistor or the like.

2. Related Art

In order to appropriately operate a PMOS transistor and an NMOS transistor, it is necessary to control the threshold voltage of these transistors. Therefore, controls of work function or composition of the gate electrodes of the PMOS transistor and the NMOS transistor have been studied. Further, in order to avoid the depletion of the gate electrode, metal gates have been studied to be utilized. Among the metal gates, many studies have been conducted for Fully Silicided (FUSI) gate technique in which the gate electrode is fully silicided to an interface of a gate insulating film because of its adaptability to the conventional manufacturing process of the transistor.

In Japanese Laid-Open Patent Publication No. 2006-100431, a method of manufacturing a semiconductor device including a PMOS transistor and an NMOS transistor is disclosed. In this method, gate insulating films for the transistors are composed of silicon oxynitride (SiON) film and gate electrodes for the transistors are composed of poly-silicon, where boron is introduced into the gate electrode of the PMOS transistor and arsenic is introduced into the gate electrode of the NMOS transistor as impurities with use of resist masks. Then, Ni is formed over the gate electrodes for silicidation of the poly-silicon to have them fully silicided. By distributing the impurities into the interface between the gate insulating films and the FUSI gate electrodes, the work functions of the transistors are controlled.

It is disclosed in IEEE 2005 "Physical Mechanism of Work Function Modulation due to Impurity Pileup at Ni-FUSI/SiO(N) Interface", that the composition or orientation of silicide phase depends on impurity which is introduced into the silicon before silicidation.

In IEDM 2004 "Dual Workfunction Ni-Silicide/HfSiON Gate Stacks by Phase-Controlled Full-Silicidation (PC-FUSI) Technique for 45 nm-node LSTP and LOP Devices" and Symposium on VLSI Technology Digest of Technical Papers 2005 "Highly Reliable HfSiON CMOSFET with Phase Controlled NiSi (NFET) and $Ni_3Si$ (PEET) FUSI Gate Electrode", phase of the FUSI gate electrodes are appropriately controlled for the PMOS transistor and the NMOS transistor by changing Ni film thickness when forming the FUSI gate electrodes on HfSiON gate insulating films. With this structure, the threshold voltage of the CMOS can be appropriately controlled.

In Symposium on VLSI Technology Digest of Technical Papers 2006 "Dual work function phase controlled Ni-FUSI CMOS (NiSi NMOS, $Ni_2Si$ or $Ni_{31}Si_{12}$ PMOS): Manufacturability, Reliability & Process Window Improvement by Sacrificial SiGe cap", and IEEE 2005 "CMOS Integration of Dual Work Function Phase Controlled Ni FUSI with Simultaneous Silicidation of NMOS (NiSi) and PMOS (Ni-rich silicide) Gates on HfSiON", the formation of FUSI electrodes having appropriate silicide phase by performing an etch back of the poly-silicon of the PMOS transistor to suppress the volume expansion at the time of forming Ni rich silicide. In these documents, impurity is not introduced into the gate electrodes and the composition of silicide phase is controlled by the thickness ratio of the Ni layer and the poly-silicon layer. In these documents, HfSiON is used as gate insulating films.

When manufacturing a device including a PMOS transistor and an NMOS transistor each having a FUSI gate electrode, the process flow will be complicated in order to appropriately control the composition of silicide phase of the gate electrodes, which are formed from poly-silicon, for both of the NMOS and PMOS transistors.

SUMMARY

In one embodiment, there is provided a method of manufacturing a semiconductor device including an NMOS transistor and a PMOS transistor, comprising:

forming a silicon layer over a substrate through a gate insulating film;

forming a first gate electrode and a second gate electrode by patterning the silicon layer, the first gate electrode being a gate electrode of the NMOS transistor, and the second gate electrode being a gate electrode of the PMOS transistor;

selectively forming a silicon oxide film on the first gate electrode which is formed of silicon;

after the selectively forming the silicon oxide film, forming a first metallic layer formed of a metal capable of forming a silicide over the first and second gate electrodes; and performing a first heat treatment such that a first silicide layer of a silicide of the first metallic layer is formed.

According to the above method, the silicon oxide film is selectively formed on the first gate electrode. Here, the silicon oxide film selectively formed on the first gate functions as a prevention layer that prevents the diffusion of the metal such as nickel in the first metallic layer into the silicon when the first metallic layer is formed thereon and the first heat treatment is performed. Therefore, with this silicon oxide film, when performing the first heat treatment, the formation of the silicide at the first gate electrode can be suppressed. Because of this suppression, the silicide composition of the NMOS to be silicon richer than that of the PMOS without suppressing supplying the metal capable of forming a silicide such as nickel to the silicon of the NMOS.

According to the present invention, a method of manufacturing a semiconductor device by which the silicide compositions appropriate for both the NMOS and the PMOS can be provided.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 11A to 14B are sectional views showing processes of manufacturing a semiconductor device in another embodiment of the present invention.

DETAILED DESCRIPTION

Figure 1A:
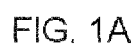
FIGS. 1A to 4B are sectional views showing processes of manufacturing a semiconductor device in one embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Paragraphs below will describe embodiments of the present invention, referring to the attached drawings. In all drawings, any similar constituents will be given with similar reference numerals, and explanation therefore will not be repeated.

According to one embodiment of the present invention, there is provided a method of manufacturing the semiconductor device including an NMOS (Negative channel Metal Oxide Semiconductor) transistor and a PMOS (Positive channel Metal Oxide Semiconductor) transistor. The method includes the following (a) to (e).

(a) forming a silicon layer over a substrate through a gate insulating film;
(b) forming a first gate electrode and a second gate electrode by patterning the silicon layer, the first gate electrode being a gate electrode of the NMOS transistor, and the second gate electrode being a gate electrode of the PMOS transistor;
(c) selectively forming a silicon oxide film on the first gate electrode which is formed of silicon;
(d) after the selectively forming the silicon oxide film, forming a first metallic layer formed of a metal capable of forming a silicide over the first and second gate electrodes; and
(e) performing a first heat treatment such that a first silicide layer of a silicide of the first metallic layer is formed.

Preferably, before the selectively forming the silicon oxide film, introducing a first impurity which promotes the formation of the silicon oxide film into the first gate electrode may be performed. The first impurity may preferably include arsenic (As). In the introducing the first impurity, arsenic may preferably be introduced into the first gate electrode as the first impurity such that the introduction amount of arsenic into the first gate electrode is $3 \times 10^{15}$ cm$^{-2}$ or above.

Further, preferably, before the selectively forming the silicon oxide film, introducing a second impurity which suppresses the formation of a silicon oxide film into the second gate electrode may be performed. The second impurity may preferably include boron (B). In the introducing the second impurity, boron may preferably be introduced into the second gate electrode as the second impurity such that the introduction amount of boron into the second gate electrode is $7 \times 10^{5}$ cm$^{-2}$ or above.

The present inventors have found that the silicidation of poly-silicon proceeds depending on the kind of impurities introduced therein when a chemical oxide film is formed thereon. Table 1 shows the silicidation result of poly-silicon to which impurities such as phosphorus (P), As, or B is introduced and on which a chemical oxide film is formed. The chemical oxide film is formed with use of an aqueous solution of hydrochloric acid-peroxide mixture (HPM) having the mixture ratio of HCl:$H_2O_2$:$H_2O$=3:1:1, and heated at 70 degree centigrade or with use of an aqueous solution of sulphuric acid-peroxide mixture (SPM) having the mixture ratio of $H_2SO_4$:$H_2O_2$=4:1, and heated at 100 degree centigrade.

TABLE 1

| PRE-TREATMENT | FUSI Temp(° C.) | FUSI time(min) | non-dope | P | As | B |
|---|---|---|---|---|---|---|
| SPM 5 min | 400 | 5 | X | X | X | ○ |
| HPM 5 min | 400 | 5 | ○ | X | X | ○ |

○ ... PROCEED
X ... PREVENTED
HPM HCl:$H_2O_2$:$H_2O$ = 3:1:1, 70° C.
SPM $H_2SO_4$:$H_2O_2$ = 4:1, 100° C.

According to Table 1, when the chemical oxide film is formed with use of the aqueous solution of HPM, and when no impurity is introduced (non-doped) or B is introduced, the silicidation of the poly-silicon proceeds. On the other hand, when the chemical oxide film is formed with use of the aqueous solution of HPM, and when As or P is introduced, the silicidation of the poly-silicon is prevented. This is because the chemical oxide film which has high density or thick enough to prevent the silicidation of the poly-silicon is formed on the poly-silicon when As or P is introduced therein while the chemical oxide film which has low density or thin to proceed the silicidation of the poly-silicon is formed on the poly-silicon when no impurity is introduced or B is introduced therein. Between As and P, As is more preferable for the impurity to prevent the silicidation of the poly-silicon because the silicidation of the poly-silicon is prevented even when the density of the As is low. Accordingly, considering the process margin, As is preferable for the impurity to prevent the silicidation of the poly-silicon.

Table 1 also shows the silicidation result of poly-silicon when the chemical oxide film is formed with use of the aqueous solution of SPM having the mixture ratio of $H_2SO_4$:$H_2O_2$=4:1, and heated at 100 degree centigrade. In this case, it is found that when no impurity is introduced (non-doped) or As or P is introduced, the silicidation of the poly-silicon is prevented. On the other hand when B is introduced, the silicidation of the poly-silicon proceeds. Thus, when the chemical oxide film is formed with use of SPM, it is better to introduce B as an impurity to the poly-silicon of the PMOS transistor to promote the silicidation while no impurity is necessary to be introduced to the poly-silicon of the NMOS transistor to prevent the silicidation.

It should be noted that the process margin can be widen by introducing B to the poly-silicon of the PMOS transistor to promote the silicidation while introducing As to the poly-silicon of the NMOS transistor to prevent the silicidation.

According to the present embodiment, the silicon oxide film that can prevent the diffusion of the metal such as nickel into the silicon is selectively formed on the first gate electrode. With this silicon oxide film, when performing the first heat treatment, the silicidation at the first gate electrode can be suppressed. Because of this suppression, the silicide composition of the NMOS can be silicon richer than that of the PMOS without suppressing supplying the metal capable of forming a silicide such as nickel to the silicon of the NMOS. It means that the composition ratio of silicon to the metal capable of forming a silicide of the silicide of the NMOS transistor can be made higher than that of the PMOS transistor. For example, the silicide of the NMOS may be NiSi$_2$ or NiSi and the silicide of the PMOS may be Ni$_3$Si or Ni$_{31}$Si$_{12}$. For example, as for NiSi$_2$, the composition ratio of silicon to the metal capable of forming a silicide is two. As for Ni$_3$Si, the composition ratio of silicon to the metal capable of forming a silicide is ⅓. Thus, according to the present embodiment, the method of manufacturing a semiconductor device in which the silicide composition can be appropriately controlled in both the NMOS transistor and the PMOS transistor is provided.

The examples according to the present invention will be explained in the following. In each example, poly-silicon is used as the silicon layer, a HfSiON film formed on a base oxide film is used as the gate insulating film, and Ni is used as the metal capable of forming a silicide for forming FUSI electrode.

Alternatively, as for the silicon layer, amorphous silicon may be used. As for the gate insulating film, a gate insulating film with a high dielectric constant including Hf such as $HfO_2$, HfON, HfLaON or the like may be used. Precisely, at least a part of the gate insulating film which is in contact with the gate electrode may be Hf containing oxide, Hf silicate, nitride of Hf containing oxide, or nitride of Hf silicate. As for the metal capable of forming a silicide for forming FUSI electrode, Pt, Pd or the like may be used.

FIRST EXAMPLE

An oxide film having a thickness of 1.0 nm is formed over the silicon substrate 1 by a heat oxidation method. The oxide film functions as a base for a gate insulating film with a high dielectric constant. Then, a HfSiO film having a thickness of 2.0 nm is formed on the oxide film by a chemical vapor deposition (CVD) method. The formed HfSiO film is nitrided by a plasma nitridation method to form a HfSiON gate insulating film 2 (FIG. 1A). The region for the NMOS is shown at the left side and the region for the PMOS is shown at the right side in FIGS. 1A to 4B, respectively.

Figure 1B:

Next, a poly-silicon layer 3 having a thickness of 100 nm is formed on the gate insulating film 2. Then, by using a photolithographic method, As is selectively introduced into the region for the NMOS of the poly-silicon layer 3 at a condition of 10 keV and $6 \times 10^{15}$ $cm^{-2}$. The selective ion implantation of As is performed by masking the region for the PMOS with a resist 10. With this process, a poly-silicon layer with As 20 is formed only at the region for the NMOS (FIG. 1B).

Figure 1C:
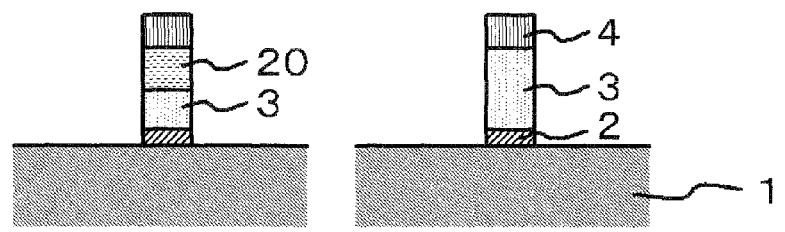

Thereafter, a nitride film 4 having a thickness of 50 nm is formed on the poly-silicon layer with As 20 and the poly-silicon layer 3. The nitride film 4 functions as a hard mask for patterning the poly-silicon layer with As 20, the poly-silicon layer 3, and the gate insulating film 2 into gate shapes. Firstly, the nitride film 4 is processed into gate shapes by using photolithographic method with a resist film (not shown). Then with the nitride film 4 used as the hard mask, the poly-silicon layer with As 20, the poly-silicon layer 3, and the gate insulating film 2 are etched (FIG. 1C).

Figure 2A:
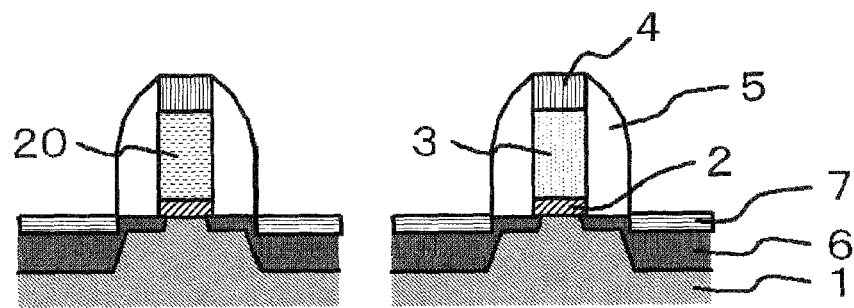

After forming an oxide offset spacer having a thickness of 8 nm, ion implantation to the extension pocket and activation are performed. Then, sidewalls 5 each having a thickness of 40 nm are formed at the sides of the gate shaped silicon layer with As 20, the poly-silicon layer 3, and the gate insulating film 2. Thereafter, ion implantation and activation by spike anneal at 900 degree centigrade or above are performed to form the source-drain region 6. By these activation with heat treatment, As introduced into the region for the NMOS diffuses to whole area of the gate electrode of the NMOS. The activation in this example may typically be a heat treatment at 900 degree centigrade or above to have impurities introduced into the silicon function as donor or accepter. Then, after a native oxide film formed on the source-drain region 6 is removed, a Ni layer having a thickness of 8 nm is formed by a sputtering method. Thereafter, the Ni layer is performed with a heat treatment to form a Ni-silicide 7 having a thickness of about 20 nm on the source-drain region 6. At this time, the silicide is not formed on the poly-silicon layer with As 20 and the poly-silicon layer 3 as they are covered with the nitride film 4 (FIG. 2A).

Figure 2B:
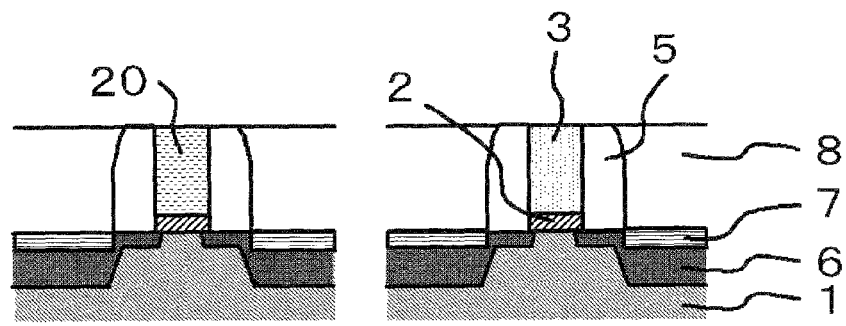

Then, an interlayer dielectric 8 formed of an oxide film having a thickness of 300 nm or above is formed all over the substrate 1. Then, the interlayer dielectric 8 is flattened by a chemical mechanical polishing (CMP) and further etch back is performed to expose the upper portions of the poly-silicon layer with As 20 and the poly-silicon layer 3 with having the source-drain region 6 covered with the interlayer dielectric 8. In this process, the nitride film 4 used as the hard mask is removed by the CMP or the etch back (FIG. 2B).

Figure 3A:
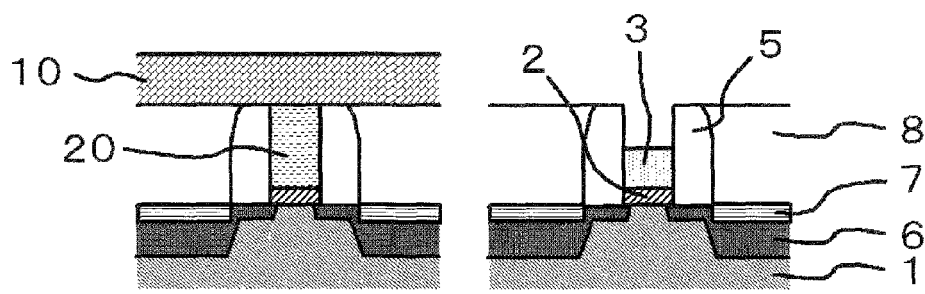

Then, only the region for the NMOS is covered with the resist 10 by photolithographic method to selectively etch back the poly-silicon 3 in the region for the PMOS (FIG. 3A). The etch back depth may appropriately adjusted to have the heights of the gate electrode of NMOS and PMOS after full silicidation become substantially equal. In this example, as the poly-silicon 3 of the PMOS is formed into $Ni_{31}Si_{12}$ and the poly-silicon layer with As 20 of the NMOS is formed into $NiSi_2$, the etch back depth is adjusted to 50 nm which is about a half of the thickness of the poly-silicon 3.

Figure 3B:
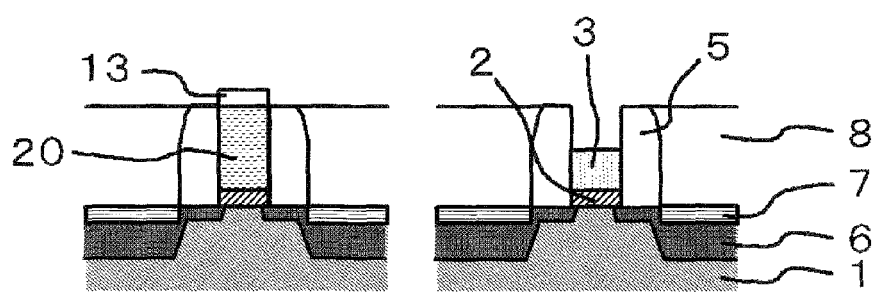

After removing the resist 10, native oxide films are removed from the surface of the poly-silicon by performing a dry-etching using a $NF_3/NH_3$ mixed gas or a wet-etching using a diluted hydrofluoric acid for a short period. Thereafter, a silicon oxide film 13 is formed on the poly-silicon layer with As 20 of the NMOS and the poly-silicon layer 3 of the PMOS by a surface oxidization. According to the present example, a chemical oxide film which serves as the silicon oxide film 13 is formed by soaking the structure in an aqueous solution of hydrochloric acid-peroxide mixture (HPM) having the mixture ratio of $HCl:H_2O_2:H_2O=3:1:1$, and heated at 70 degree centigrade for five minutes (FIG. 3B). At this time, as the poly-silicon layer with As 20 of the NMOS includes As, the relatively thick chemical oxide film is formed thereon. On the other hand, as the poly-silicon layer 3 of the PMOS does not include impurity such as As, the relatively thin chemical oxide film is formed thereon. Therefore, by forming the silicon oxide film 13, silicidation on the silicon layer of the NMOS in which As is introduced is suppressed while silicidation proceeds on the silicon layer of the PMOS in which As is not introduced.

After washing with running water, a first silicidation is performed. Firstly, Ni layer having a thickness of 80 nm and serving as the metal for full silicidation is formed over the poly-silicon 3 and the poly-silicon layer with As 20 at a room temperature. When whole of the Ni layer having the thickness of 80 nm and the poly-silicon having the thickness of 50 nm react with each other, Ni-silicide in which the composition ratio is about Ni:Si=3:1 can be formed.

Figure 3C:
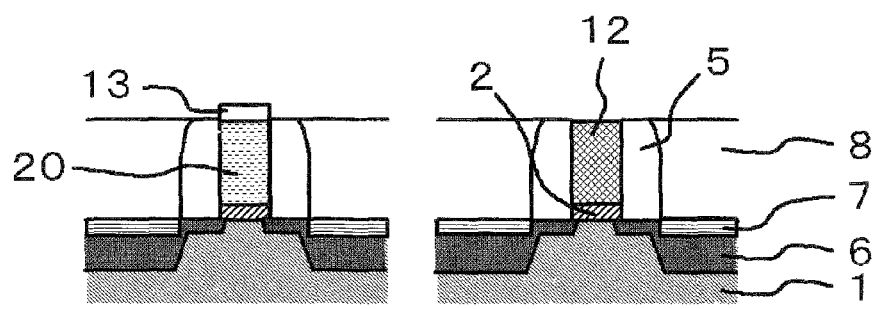

Thereafter, a first heat treatment is performed to have the poly-silicon 3 of the gate of the PMOS fully silicided. The first heat treatment is performed under 400 degree centigrade in $N_2$ atmosphere for five minutes. Then, unreacted Ni is removed by the SPM (FIG. 3C).

As the relatively thick chemical oxide film is formed on the poly-silicon layer with As 20 of the NMOS, the silicidation of the poly-silicon of the NMOS is totally suppressed and the poly-silicon of the NMOS remains unreacted. On the other hand, at the poly-silicon layer 3 of the PMOS, almost all of the non-dope poly-silicon and the Ni layer having the thickness of 80 nm react to form a Ni full silicide in which the composition ratio is about Ni:Si=3:1 is formed. This Ni full silicide is proved to be $Ni_{31}Si_{12}$ by an X-ray diffraction. The full silicide gate electrode 12 obtained by this silicidation expands about two times as that of the original poly-silicon, thus the height of the gate electrode becomes about 100 nm which is almost same as that of the gate electrode of the NMOS.

Figure 5:
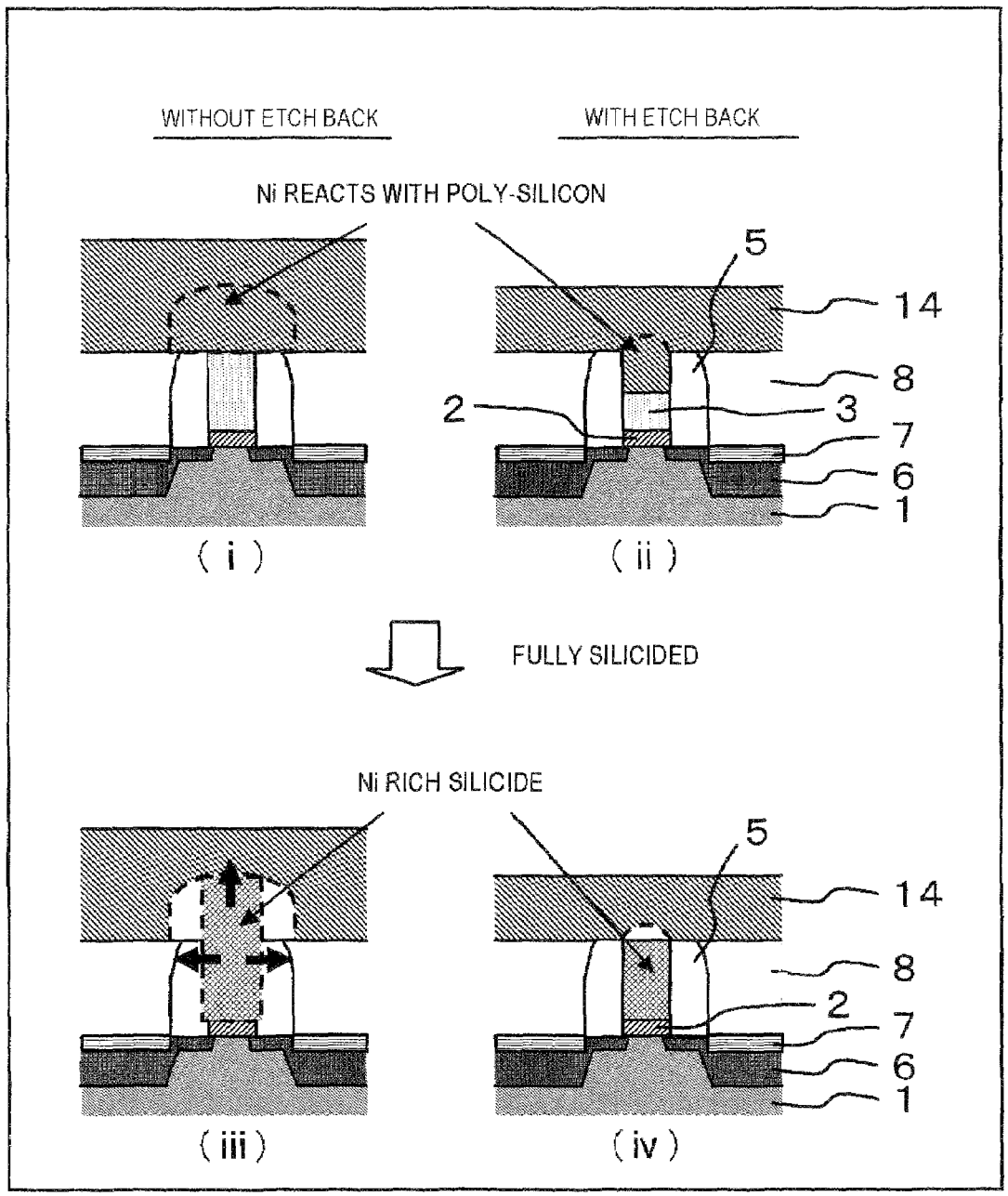
FIG. 5 is a schematic view for explaining the effect of the etch back of poly-silicon at the PMOS transistor.

FIG. 5 is a schematic view for explaining the effect of the etch back of poly-silicon at the PMOS transistor. (i) and (ii) are sectional views showing the state of the device before silicidation. (iii) and (iv) are sectional views showing the state of the device after silicidation.

As shown as (i) and (iii), if the etch back of the poly-silicon is not performed, a large area of the Ni layer 14 reacts with the poly-silicon 3 so that the full silicided gate which is expanded to twice as that of the original poly-silicon spreads out toward the sidewall 5 to break the device. On the other hand as shown as (ii) and (iv), when the etch back of the poly-silicon is performed and a concave portion is formed in the sidewall 5, the amount of both the poly-silicon and the Ni layer 14 which reacts with the poly-silicon 3 can be reduced. As the Ni is consumed to become the full silicided gate, the volume of the full silicided gate becomes smaller than the total volume of the original poly-silicon and the Ni layer 14 which reacts with the poly-silicon 3. Therefore, no force is applied to the sidewall 5 or other elements even the full silicided gate is formed. Thus, the break of the device can be prevented.

Figure 4A:
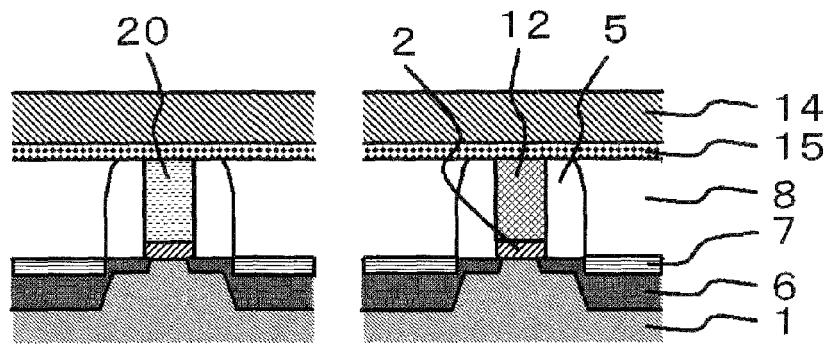

Referring to FIG. 4A, oxide films are removed from the surface of the poly-silicon layer with As 20 and the full silicide gate electrode 12 by performing a dry-etching using a $NF_3/NH_3$ mixed gas or a wet-etching using a diluted hydrofluoric acid for a short period. Then, a second silicidation is performed. Firstly, Ti film 15 having a thickness of 5 nm is formed over the full silicide gate electrode 12 and the poly-silicon layer with As 20. Successively, Ni film 14 having a thickness of 30 nm is formed on the Ti film 15 (FIG. 4A).

Figure 4B:
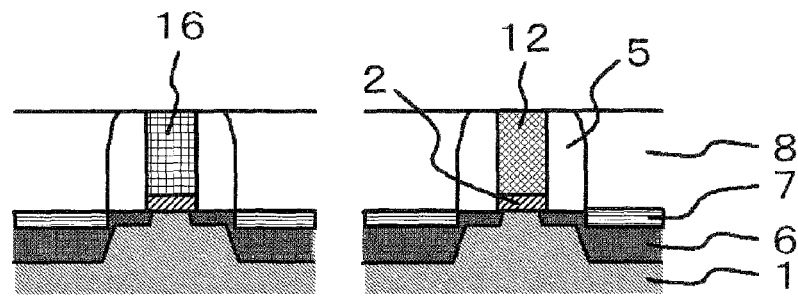

When whole of the Ni film 14 having the thickness of 30 nm and the poly-silicon having the thickness of 100 nm react with each other, Ni-silicide in which the composition ratio is about Ni:Si=1:2 can be formed. Here, the Ti film 15 functions as a barrier that suppresses the supply of Ni into the Si. A second heat treatment is performed on the structure under 450 degree centigrade in $N_2$ atmosphere for five minutes. Then, unreacted Ni is removed by the SPM (FIG. 4B).

As the chemical oxide film 13 is removed before the second silicidation, the silicidation of the poly-silicon layer with As 20 of the NMOS proceeds. As mentioned above, as the Ti film 15 incorporated between the poly-silicon layer with As 20 and the Ni film 14 functions as the barrier, the supply of the Ni into Si of the poly-silicon layer with As 20 is suppressed to form unusual $NiSi_2$ at a relatively low temperature of 450 degree centigrade.

As for the full silicide gate electrode 12 of the PMOS, it already has the most stable composition at the temperature around 450 degree centigrade by the first silicidation, and no more reaction with Ni occurs. As a result, a full silicide gate electrode 16 having a composition of $NiSi_2$ phase is formed at the NMOS and the full silicide gate electrode 12 having the composition of $Ni_{31}Si_{12}$ phase is formed at the PMOS.

According to this example, the silicon oxide film 13 is composed of a chemical oxide film formed by HPM. This chemical oxide film includes a lot of dangling bonds and is not so hard. Thus, when the thickness of the silicon oxide film 13 formed on the poly-silicon layer 3 of the PMOS is relatively thin as about 1 nm, the silicidation of the poly-silicon layer can proceed through the silicon oxide film 13. The silicon oxide film 13 of the NMOS is formed thicker on the poly-silicon layer with As 20 than that on the poly-silicon layer 3 of the PMOS by the influence of As. Thus, the silicon oxide film 13 can suppress the silicidation even though it is not hard. As far as the formed silicon oxide film can have such film characteristics, the silicon oxide film 13 may be a chemical oxide film formed by another chemical solution, or a silicon film formed by another oxide film forming method such as a plasma process with an oxidizing gas such an oxygen at a room temperature, a heat treatment with an oxidizing gas such an oxygen or the like. However, it is necessary to find an optimal condition to form the silicon oxide film 13 because if the silicon oxide film formed on the silicon layer of the PMOS is too thick or is too hard, the silicidation cannot proceed at the silicon layer of the PMOS. Further, if the silicon oxide film 13 formed on the silicon layer of the NMOS is too thin or has poor density, the silicidation proceeds at the silicon layer of the PMOS.

Further, the formation of the silicon oxide film 13 depends on the amount of As introduced in the poly-silicon layer 3, and when the amount of As introduced in the poly-silicon layer 3 is not enough, the formation of the silicon oxide film 13 does not proceed well. Although the introduction amount of As is exemplified as $6 \times 10^{15}$ $cm^{-2}$ in the above example, it is preferable to set the amount of As introduced in the poly-silicon layer 3 as $3 \times 10^{15}$ $cm^{-2}$ or above so that an appropriate silicon oxide film is formed on the silicon layer of the NMOS while thin silicon oxide film is formed on the non-doped silicon layer of the PMOS.

By setting the composition ratio as described above, the effective work functions of the fully silicided gates of the NMOS and PMOS become 4.4 eV and 4.8 eV, respectively. As for the NMOS, the effective work function can be lowered for 0.1V than that of the usual NiSi electrode (whose effective work function is 4.5 eV) and the for the PMOS, the effective work function can be increased for 0.3V than that of the usual NiSi electrode.

According to the present example, because the exposing process of the upper portions of the poly-silicon layer can be performed for both the NMOS and PMOS at the same time, the method of silicidation can be simplified compared with performing the silicidation of the NMOS and PMOS separately. The above process according to the present example includes twice of the photolithographic methods one for introducing As into the poly silicon layer right after forming the poly silicon layer and one for selectively etching back the poly-silicon 3. It is same as the conventional process of forming the poly-silicon gate electrode that includes twice of the photolithographic methods for introducing the impurities into gates of both of NMOS and PMOS right after forming the poly-silicon layer.

SECOND EXAMPLE

The method according to the present example is different from that of the first example in timing of introducing the impurity. In this example, the introduction of the impurity is not performed right after forming the poly-silicon layer but performed after the upper surface of the poly-silicon layer is exposed without the photolithographic method. The process of the example will be explained with referring to FIGS. 6A to 9B. The region for the NMOS is shown at the left side and the region for the PMOS is shown at the right side in FIGS. 6A to 9B, respectively.

Figure 6A:
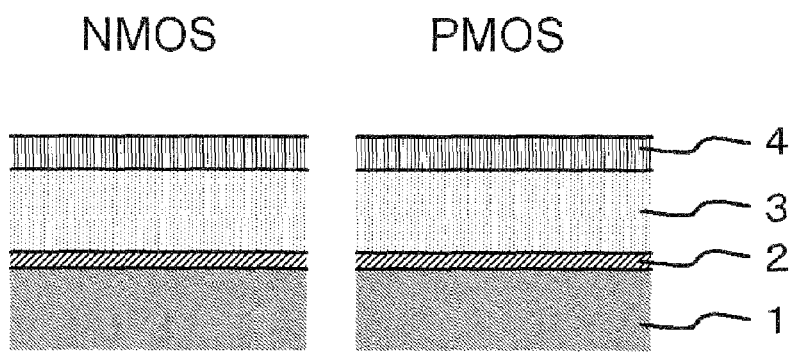
FIGS. 6A to 9B are sectional views showing processes of manufacturing a semiconductor device in another embodiment of the present invention.
Figure 6B:
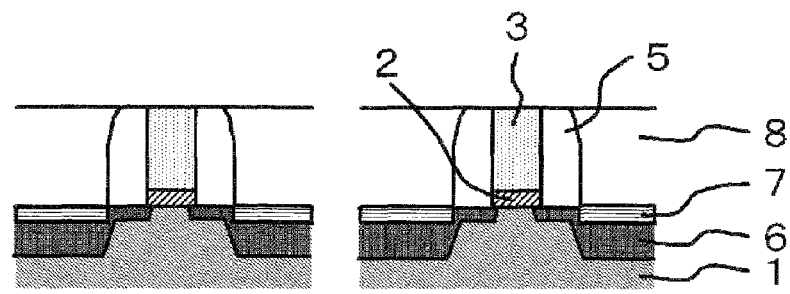

After forming the gate insulating film 2 and the poly-silicon layer 3, the nitride film 4 for patterning the gate is formed without introducing the impurity into the silicon layer 3 (FIG. 6A). After this process, same processes as those of the first example explained with referring to FIGS. 1C to 2B are performed until the upper portions of the poly-silicon layer is exposed (FIG. 6B).

Figure 7A:
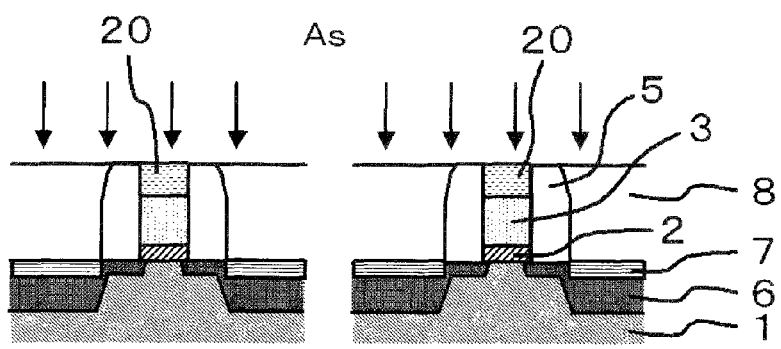

Next, without using a photolithographic method, a first impurity which promotes the formation of a silicon oxide film is introduced into both of the gate silicon layers of the NMOS and the PMOS. As for an example, As is introduced into both of the gate silicon layers of the NMOS and the PMOS at a condition of 2 keV and $4 \times 10^{15}$ cm$^{-2}$. With this condition, without a heat treatment for dispersing the impurity, most of As (20) exist at the upper portion of the silicon layer within 30 nm from the upper surface (FIG. 7A).

Figure 7B:
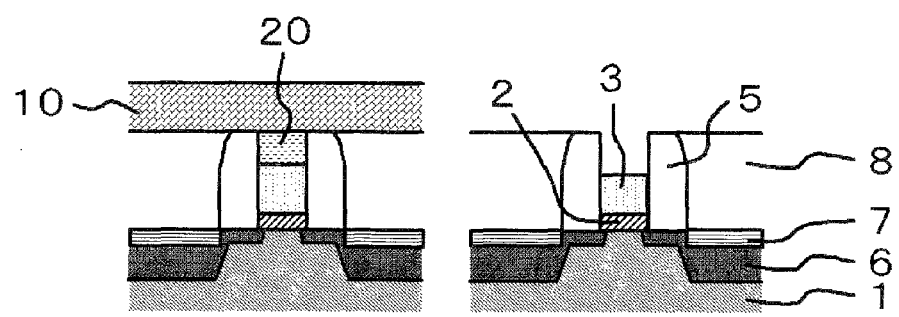

Subsequently, by using the photolithographic method as same as the first example, the poly-silicon 3 is selectively etched back for 50 nm only at the region for the NMOS (FIG. 7B). As a result, As only remains at the region for the NMOS and the region for the PMOS becomes non-doped condition as the most of As is removed by the etch back. In other words, the area where As is introduced is removed from the gate electrode of the PMOS. At this time, not all of the impurity is necessary to be removed from the gate electrode of the PMOS as far as the silicon oxide film to suppress the silicidation is not formed at the gate electrode of the PMOS.

In this example, the condition for introducing As is set lower than the first example, even with this condition, As exist at the upper surface at a high concentration. In order to promote the formation of the silicon oxide film, As only need to be exist at the upper surface at a high concentration, and the influence of As to the source-drain region should be reduced. Thus, it is preferable to set the condition for introducing As lower in this example.

Figure 8A:
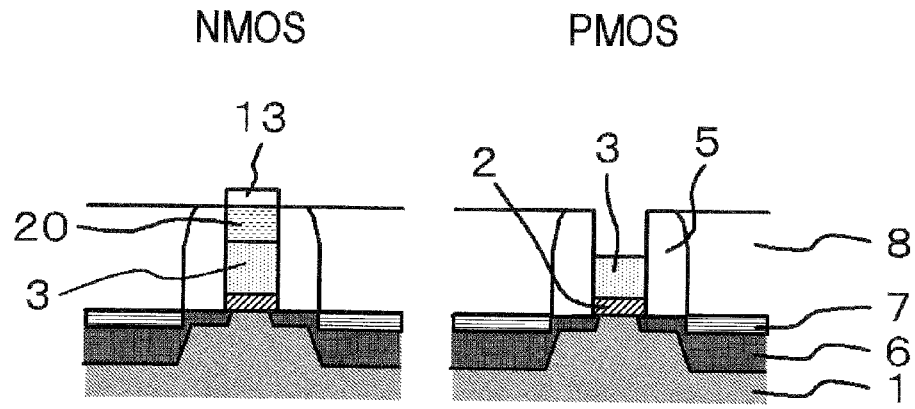
Figure 8B:
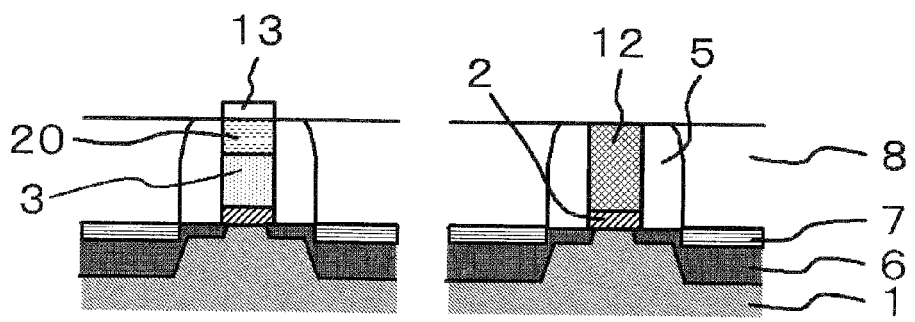
Figure 9A:
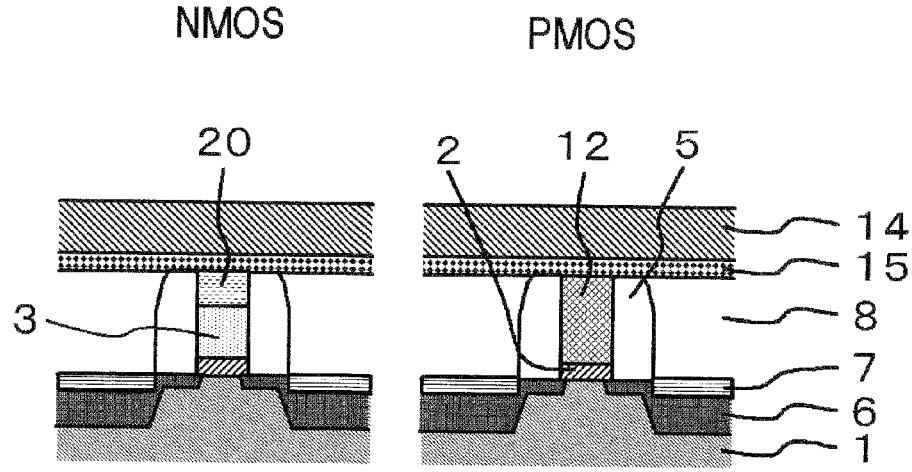
Figure 9B:
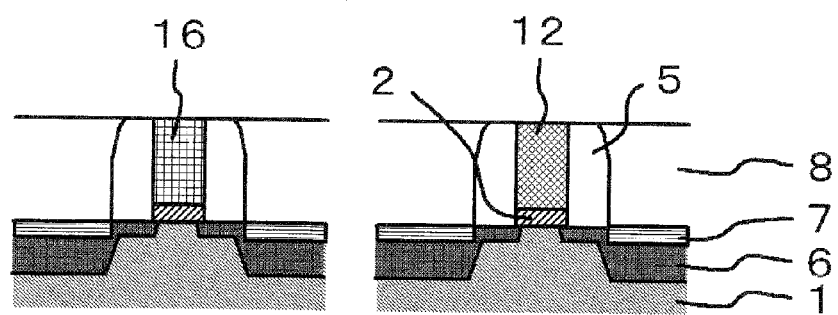

After removing the resist 10, native oxide films are removed from the surface of the poly-silicon by performing a dry-etching using a NF$_3$/NH$_3$ mixed gas or a wet-etching using a diluted hydrofluoric acid for a short period. Thereafter, the silicon oxide film 13 is formed on the poly-silicon layer with As 20 of the NMOS. According to the present example, a chemical oxide film which serves as the silicon oxide film 13 is formed by soaking the structure in an aqueous solution of hydrochloric acid-peroxide mixture (HPM) having the mixture ratio of HCl:H$_2$O$_2$:H$_2$O=3:1:1, and heated at 70 degree centigrade for five minutes. Although the heat treatment to disperse As after introducing As is not performed in this example, the formation of silicon oxide film can be promoted by As introduced in the poly-silicon layer with As 20 (FIG. 8A).

After that, same processes as those of the first example are performed and the full silicide gate electrode 16 having a composition of NiSi$_2$ phase is formed at the NMOS and the full silicide gate electrode 12 having the composition of Ni$_{31}$Si$_{12}$ phase is formed at the PMOS (FIG. 8B to FIG. 9B).

Although the heat treatment to disperse As after introducing As is not performed in this example, it is confirmed that the formation of silicon oxide film can be promoted by As introduced in the poly-silicon layer with As 20.

According to the method of the present example, the process number can be reduced because only once of the photolithographic method is necessary to perform the introduction of the impurity and removal of the impurity. Further, when patterning the gate electrode, the gate electrode of both of the NMOS and PMOS are non-doped condition, both can be patterned with a same condition. Because of this, the process control becomes easy.

Figures 10A, 10B, 10C:
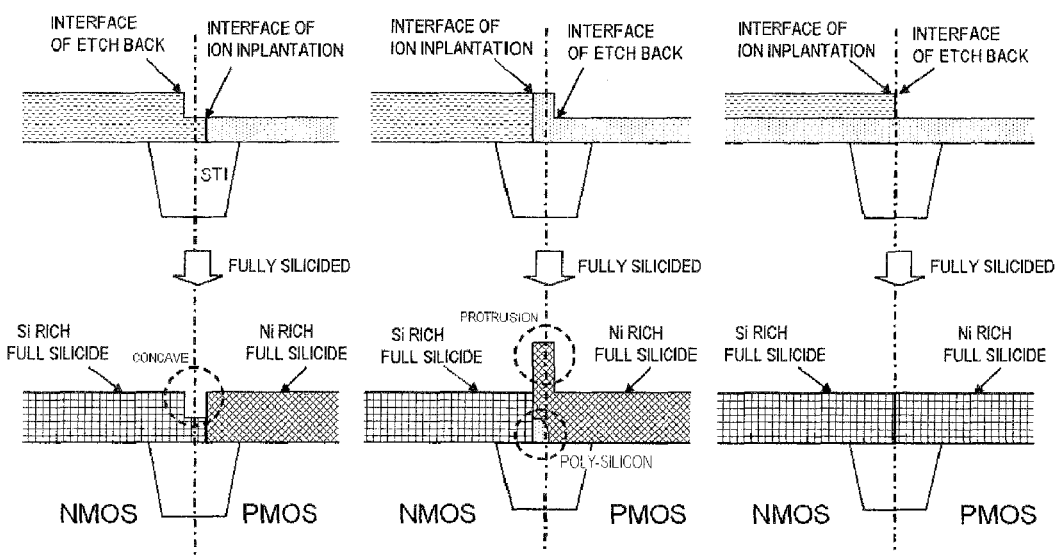
FIGS. 10A to 10C are sectional views showing the shapes of the gate electrodes at the interface between the PMOS and NMOS region.

Further, according to the present example, as the impurity is introduced into both of the NMOS and the PMOS and removed by etching back the poly-silicon layer of the PMOS. With this process, the interface between the areas one of which includes the impurity and the other of which does not include the impurity and the interface between the areas one of which is etched back and the other of which is not etched back becomes same as shown in FIG. 10C. With this condition, even after the full-silicidation, the surface between the areas can be kept flat. However, if the interface between the areas one of which includes the impurity and the other of which does not include the impurity and the interface between the areas one of which is etched back and the other of which is not etched back is not same, the surface between the areas includes concave portion or protruding portion and cannot be kept flat as shown in FIGS. 10A and 10B. This problem remarkably occurs when HfSiON is used as a gate insulating film, for example. However, according to the present example, the flat surface can be obtained.

THIRD EXAMPLE

The method according to the present example is different from that of the first example in introducing an impurity which suppresses the formation of a silicon oxide film such as B into the gate electrode of the PMOS. The process of the example will be explained with referring to FIGS. 11A to 14B. The region for the NMOS is shown at the left side and the region for the PMOS is shown at the right side in FIGS. 11A to 14B, respectively.

Figure 11A:
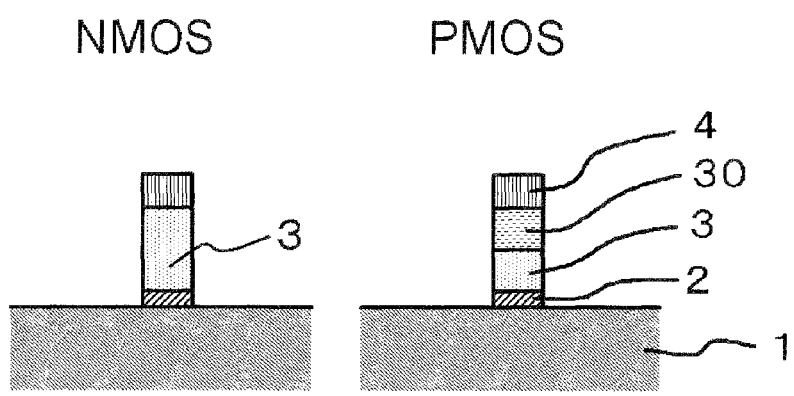

After forming the gate insulating film 2 and the poly-silicon layer 3 having a thickness of 100 nm as same as the first example, by using a lithography method, B is selectively introduced into the region for the PMOS of the poly-silicon layer 3 at a condition of 1 keV and $1 \times 10^{16}$ cm$^{-2}$. With this process, a poly-silicon layer with B 30 is formed only at the region for the PMOS. Thereafter, the nitride film 4 having a thickness of 50 nm is formed on the poly-silicon layer 3 and the poly-silicon layer with B 30. Then, by using a photolithographic method, the poly-silicon layer 3, the poly-silicon layer with B 30, and the gate insulating film 2 are etched into gate shapes (FIG. 11A).

Figure 11B:
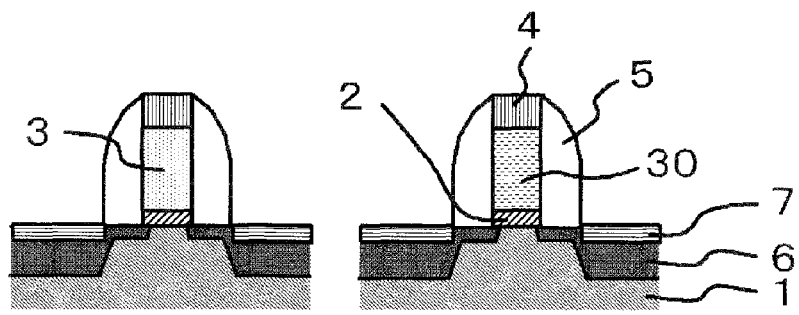

Then, ion implantation to the extension pocket and activation are performed. Then, the sidewalls 5 are formed at the sides of the gate shaped silicon layer with B 20, the poly-silicon layer 3, and the gate insulating film 2. Thereafter, ion implantation and activation by spike anneal at 900 degree centigrade or above are performed to form the source-drain region 6. By these activation with heat treatment, B introduced into the region for the PMOS diffuses to whole area of the gate electrode. The activation in this example may typically be a heat treatment at 900 degree centigrade or above to have impurities introduced into the silicon function as donor or accepter. Then, after a native oxide film formed on the source-drain region 6 is removed, a Ni layer having a thickness of 8 nm is formed by a sputtering method. Thereafter, the Ni layer is performed with a heat treatment to form the Ni-silicide 7 on the source-drain region 6 (FIG. 11B).

Figure 12A:
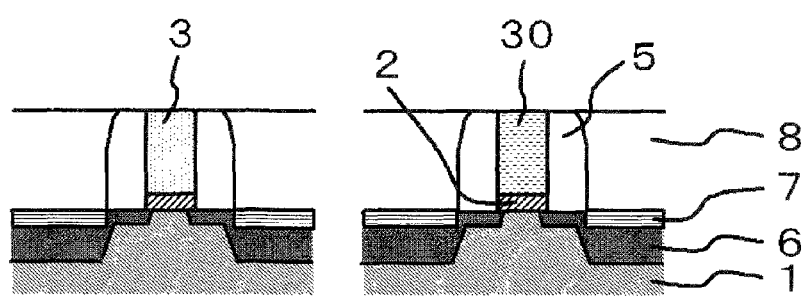

Then, the interlayer dielectric 8 is formed all over the substrate 1. Then, the interlayer dielectric 8 is flattened by the CMP and further etch back is performed to expose the upper portions of the poly-silicon layer with B 30 and the poly-silicon layer 3 with having the source-drain region 6 covered with the interlayer dielectric 8. In this process, the nitride film 4 used as the hard mask is removed by the CMP or the etch back (FIG. 12A).

Figure 12B:
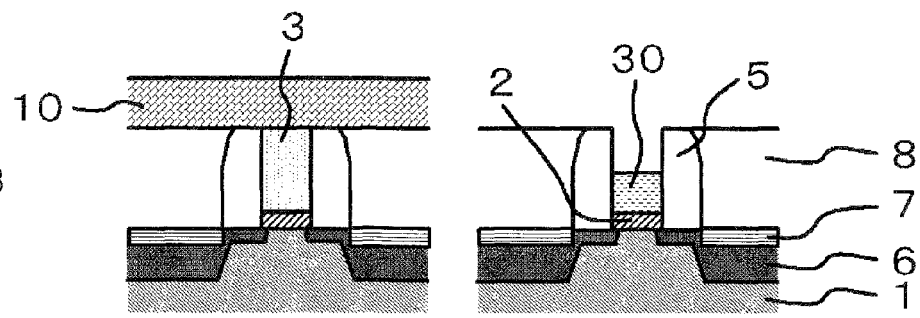

Then, only the region for the NMOS is covered with the resist 10 by photolithographic method to selectively etch back the poly-silicon layer with B 30 in the region for the PMOS (FIG. 12B). The etch back depth may appropriately adjusted to have the heights of the gate electrode of NMOS and PMOS after full silicidation become substantially equal. In this example, as the poly-silicon layer with B 30 of the PMOS is formed into $Ni_{31}Si_{12}$ and the poly-silicon layer 3 of the NMOS is formed into $NiSi_2$, the etch back depth of the poly-silicon layer with B 30 is adjusted to 50 nm which is about a half of the thickness of the poly-silicon 3. The native oxide films are removed from the surface of the poly-silicon layer with B 30 and the poly-silicon layer 3 by performing a dry-etching using a $NF_3/NH_3$ mixed gas or a wet-etching using a diluted hydrofluoric acid for a short period.

Figure 13A:
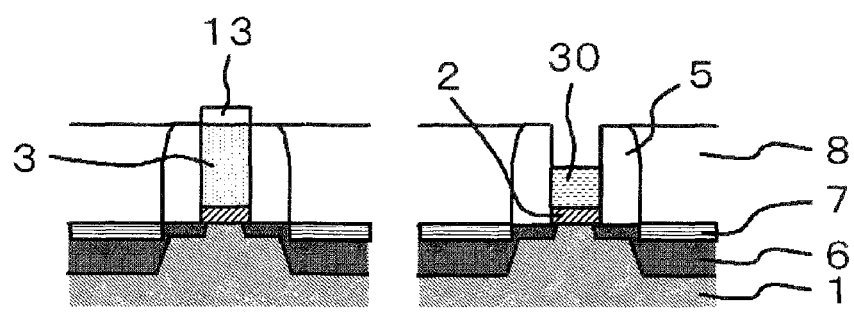

Thereafter, the silicon oxide film 13 is formed on the poly-silicon layer 3 of the NMOS and the poly-silicon layer with B 30 of the PMOS by a surface oxidization. According to the present example, a chemical oxide film which serves as the silicon oxide film 13 is formed by soaking the structure in an aqueous solution of sulphuric acid-peroxide mixture (SPM) having the mixture ratio of $H_2SO_4:H_2O_2=4:1$, and heated at 100 degree centigrade for five minutes (FIG. 13A). At this time, as silicon layer with B 30 of the PMOS includes B, the relatively thin chemical oxide film is formed thereon. On the other hand, as the poly-silicon layer 3 of the NMOS does not include impurity such as As, the relatively thick chemical oxide film is formed thereon.

Figure 13B:
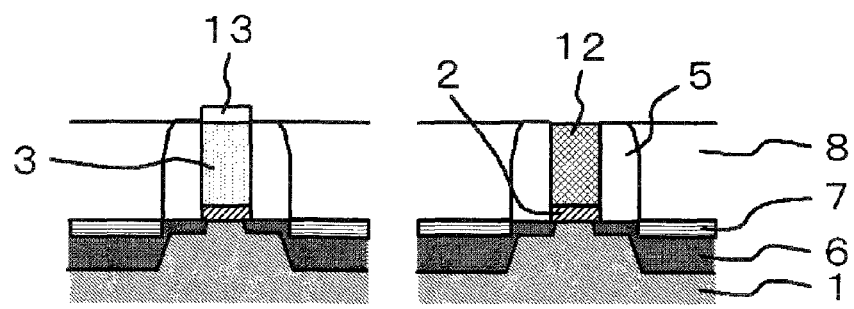

After washing with running water, a first silicidation same as described in the first example is performed. The chemical oxide film formed by the aqueous solution of SPM has relatively high density at the NMOS and the poly-silicon layer 3 of the NMOS remains unreacted even with non-doped condition. On the other hand, the chemical oxide film formed by the aqueous solution of SPM has relatively low density at the PMOS because the poly-silicon layer at the PMOS include B and the silicidation proceeds at the PMOS. As a result, as same as the first example, at the poly-silicon layer with B 30 of the PMOS, almost all of the poly-silicon and the Ni layer having the thickness of 80 nm react to form a Ni full silicide in which the composition ratio is about Ni:Si=3:1 is formed. This Ni full silicide is proved to be $Ni_{31}Si_{12}$ by an X-ray diffraction. The full silicide gate electrode 12 obtained by this silicidation expands about two times as that of the original poly-silicon, thus the height of the gate electrode becomes about 100 nm which is almost same as that of the gate electrode of the NMOS (FIG. 13B).

Figures 14A, 14B:
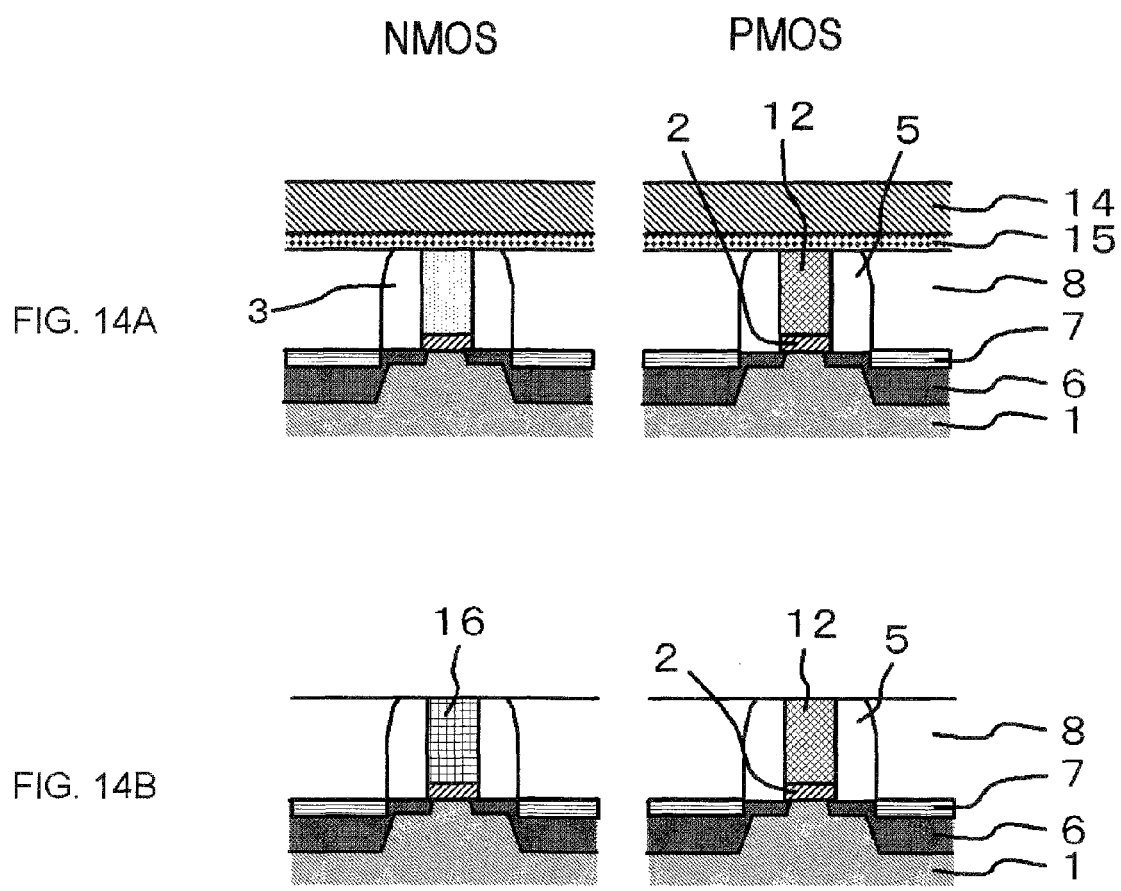

Thereafter, same processes as the first example are performed to form the full silicide gate electrode 16 having a composition of $NiSi_2$ phase is formed at the NMOS (FIGS. 14A and 14B).

By setting the composition ratio as described above, the effective work functions of the fully silicided gates of the NMOS and PMOS become 4.4 eV and 4.8 eV, respectively. As for the NMOS, the effective work function can be lowered for 0.1V than that of the usual NiSi electrode (whose effective work function is 4.5 eV) and the for the PMOS, the effective work function can be increased for 0.3V than that of the usual NiSi electrode.

According to the method of the present example, the process number can be reduced because the CMP to expose the surface of the poly-silicon for the silicidation is performed only once at the same time for both of the NMOS and the PMOS.

Although the introduction amount of B is exemplified as $1\times10^{16}$ $cm^{-2}$ in the above example, it is preferable to set the amount of B introduced in the poly-silicon layer 3 as $7\times10^{15}$ $cm^{-2}$ or above so that the formation of the silicon oxide film can be properly suppressed.

In addition, the introduction of the impurity such as B which suppresses the formation of a silicon oxide film into the poly-silicon of the PMOS as described in this example may be performed in addition to the introduction of the impurity such as As as described in the first and the second examples which promotes the formation of the silicon oxide film. In such the case, the silicon oxide film may be formed by an aqueous solution of sulphuric acid-peroxide mixture (SPM) having the mixture ratio of $H_2SO_4:H_2O_2=4:1$, and heated at 100 degree centigrade for five minutes. By using the aqueous solution of SPM, the formation of the silicon oxide film at the PMOS can be suppressed while the thicker silicon oxide film can be formed at the NMOS compared with when using the aqueous solution of HPM. Thus, the process margin of promotion and suppression of the silicidation can be widen.

FOURTH EXAMPLE

Figure 15:
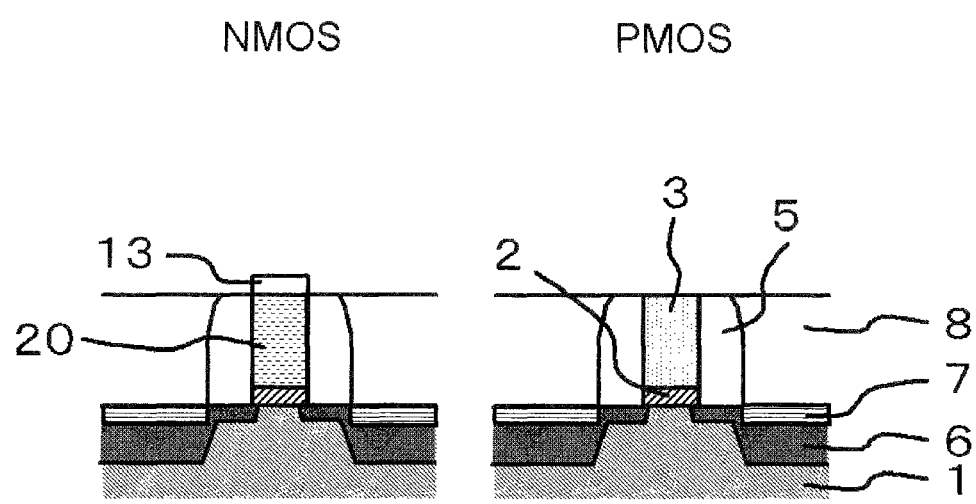
FIG. 15 is a sectional view showing a semiconductor device in another embodiment of the present invention.

The method according to the present example is different from that of the above examples in forming the silicon oxide film 13 without selectively etching the silicon layer of the PMOS. The processes of the example are same as those of the first example shown in FIGS. 1A to 2B. After the condition shown in FIG. 2B is formed, the silicon oxide film 13 is formed without the etch back of the poly-silicon layer 3 at the PMOS (FIG. 15). Then, same processes as those of the first example shown in FIGS. 3C to 4B are performed.

Although the silicon oxide film is formed by the chemical solution process with a solution including oxidizing agent in the above examples, the silicon oxide film may be formed by a plasma process with an oxidizing gas, or a heat treatment with an oxidizing gas.

The metal capable of forming a silicide may be Ni. As Ni-silicide is known to have a various compositions including Ni:Si=3:1 ($Ni_3Si$) to Ni:Si=1:2($NiSi_2$), it is capable of setting the work functions for both of the NMOS and the PMOS in a wide range when setting their work functions by controlling the silicide compositions in the fully-silicide electrodes. The metal capable of forming a silicide may be Ni, Pt, or Pd because by using such the metal to form the silicide, such the metal diffuses into silicon layer but silicon does not diffuses. Thus, the silicide formed by such the metals include less defects such as the voids.

Although $Ni_3Si$ and $NiSi_2$ are respectively used for the PMOS and the NMOS in the above examples, $Ni_3Si$ may be used for the PMOS and NiSi may be used for the NMOS. These silicides can be easily obtained by appropriately adjusting the thickness of the Ni layer or by appropriately setting the temperature of the silicidation.

Further, according to the above examples, in order to form $NiSi_2$, a method of inserting the Ti film between the poly-silicon layer and the Ni film is used, alternatively, any other methods may be used provided that a layer that can suppress the diffusion of Ni into Si is formed. For example, a method of inserting a chemical silicon oxide film or NiZr film, or a method of forming a Ni—Er alloy is known as suppressing the diffusion speed of Ni into Si to obtain $NiSi_2$.

Although HfSiON is exemplified as the gate insulating film in the above examples, other kinds of films may be used instead.

It is apparent that the present invention is not limited to the above embodiment, and may be modified and changed without departing from the scope and spirit of the invention.

What is claimed is:

1. A method of manufacturing a semiconductor device including an NMOS transistor and a PMOS transistor, comprising:

forming a silicon layer over a substrate through a gate insulating film;

forming a first gate electrode and a second gate electrode by patterning said silicon layer, said first gate electrode being a gate electrode of said NMOS transistor, and said second gate electrode being a gate electrode of said PMOS transistor;

introducing a first impurity into said first gate electrode;

removing a portion of said second gate electrode such that said second gate electrode has a thickness less than said first gate electrode after said introducing said first impurity;

selectively oxidizing said first gate electrode which is formed of silicon to form a silicon oxide film on said first gate electrode by a chemical solution process with a solution including oxidizing agent after said removing a portion of said second gate electrode;

after said selectively oxidizing said first gate electrode, forming a first metallic layer formed of a metal capable of forming a silicide over said first and second gate electrodes; and performing a first heat treatment such that the remaining portion of said second gate electrode includes a first silicide layer of a silicide of said first metallic layer such that said first gate electrode and said second gate electrode have substantially the same thickness.

2. The method of manufacturing a semiconductor device according to claim 1, wherein said introducing a first impurity promotes the formation of said silicon oxide film into said first gate electrode.

3. The method of manufacturing a semiconductor device according to claim 2, wherein said first impurity includes arsenic (As).

4. The method of manufacturing a semiconductor device according to claim 3, wherein in said introducing the first impurity, the introduction amount of arsenic introduced into said first gate electrode as said first impurity is $3 \times 10^{15} \text{cm}^{-2}$ or above.

5. The method of manufacturing a semiconductor device according to claim 1, wherein said introducing the first impurity includes:

introducing said first impurity into both of said first and second gate electrodes; and removing the portion of said second gate electrode where said first impurity is introduced.

6. The method of manufacturing a semiconductor device according to claim 1, further comprising:

before said selectively forming the silicon oxide film, introducing a second impurity which suppresses the formation of a silicon oxide film into said second gate electrode.

7. The method of manufacturing a semiconductor device according to claim 6, wherein said second impurity includes boron (B).

8. The method of manufacturing a semiconductor device according to claim 7, wherein in said introducing the second impurity, the introduction amount of boron introduced into said second gate electrode as said second impurity is $7 \times 10^{15} \text{cm}^{-2}$ or above.

9. The method of manufacturing a semiconductor device according to claim 1, further comprising:

after said performing the first heat treatment, removing said first metallic layer;

after said removing said first metallic layer, forming a second metallic layer formed of said metal capable of forming a silicide over said first and second gate electrodes; and performing a second heat treatment such that a second silicide layer of a silicide of said second metallic layer is formed;

wherein in said performing the first heat treatment, said first silicide layer is formed only on said second gate electrode among said first and second gate electrodes, and the composition ratio of the silicon to said metal capable of forming a silicide in said second silicide layer is higher than that in said first silicide layer.

10. The method of manufacturing a semiconductor device according to claim 9, further comprising:

before said selectively forming said silicon oxide film, removing any oxide layers exist on both said first and second gate electrode; and between said removing said first metallic layer and said forming said second metallic layer, removing any oxide layers exist on both said first and second gate electrode.

11. The method of manufacturing a semiconductor device according to claim 1, wherein said solution including oxidizing agent is at least one of an aqueous solution of sulphuric acid-peroxide mixture and an aqueous solution of hydrochloric acid-peroxide mixture.

12. The method of manufacturing a semiconductor device according to claim 1, wherein said metal capable of forming a silicide is nickel (Ni).

13. The method of manufacturing a semiconductor device according to claim 1, wherein in said performing the first heat treatment, a part of said second gate electrode where being in contact with said gate insulating film becomes $Ni_3Si$ or $Ni_{31}Si_{12}$ and at the same time a part of said first gate electrode where being in contact with said gate insulating film becomes $NiSi_2$ or NiSi.

14. The method of manufacturing a semiconductor device according to claim 1, wherein a part of said gate insulating film where being in contact with said gate electrode is Hf containing oxide, Hf silicate, nitride of Hf containing oxide, or nitride of Hf silicate.

15. The method of manufacturing a semiconductor device according to claim 2, further comprising:

before said selectively forming the silicon oxide film, introducing a second impurity which suppresses the formation of a silicon oxide film into said second gate electrode.

16. The method of manufacturing a semiconductor device according to claim 9, wherein said second silicide layer is $NiSi_2$ and said first silicide layer is $Ni_3Si$ or $Ni_{31}Si_{12}$.

17. A method of manufacturing a semiconductor device including a NMOS transistor and a PMOS transistor, comprising:

forming a silicon layer over a substrate through a gate insulating film;

forming a first gate electrode and a second gate electrode by patterning said silicon layer, said first gate electrode being a gate electrode of said NMOS transistor, and said second gate electrode being a gate electrode of said PMOS transistor;

introducing a first impurity into said first gate electrode;

reducing a thickness of said second gate electrode to be less than a thickness of said first gate electrode after said introducing said first impurity;

after said introducing said first impurity into said first gate electrode, selectively oxidizing said first gate electrode which is formed of silicon to form a chemical silicon oxide film on said first gate electrode by a chemical solution process with a solution including oxidizing agent after said removing a portion of said second gate electrode, said first impurity promoting the formation of said silicon oxide film;

after said selectively oxidizing said first gate electrode, forming a first metallic layer formed of a metal capable of forming a silicide over said first and second gate electrodes; and performing a first heat treatment such that a first silicide layer of a silicide of said first metallic layer is only formed on said reduced thickness of said second gate electrode, such that said first gate electrode and said second gate electrode have substantially the same thickness.

18. The method of manufacturing a semiconductor device according to claim 17, wherein said first impurity includes arsenic (As).

19. The method of manufacturing a semiconductor device according to claim 18, wherein said solution including oxidizing agent is an aqueous solution of hydrochloric acid-peroxide mixture.

* * * * *